(12) United States Patent
Shu et al.

(10) Patent No.: US 11,043,566 B2
(45) Date of Patent: Jun. 22, 2021

(54) SEMICONDUCTOR STRUCTURES IN A WIDE GATE PITCH REGION OF SEMICONDUCTOR DEVICES

(71) Applicant: GLOBALFOUNDRIES U.S. INC., Santa Clara, CA (US)

(72) Inventors: Jiehui Shu, Clifton Park, NY (US); Judson Robert Holt, Ballston Lake, NY (US); Sipeng Gu, Clifton Park, NY (US); Haiting Wang, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/599,116

(22) Filed: Oct. 10, 2019

(65) Prior Publication Data
US 2021/0111261 A1    Apr. 15, 2021

(51) Int. Cl.
| *H01L 29/423* | (2006.01) |
|---|---|
| *H01L 21/8234* | (2006.01) |
| *H01L 27/088* | (2006.01) |
| *H01L 29/417* | (2006.01) |

(52) U.S. Cl.
CPC ........... *H01L 29/42356* (2013.01); *H01L 21/823437* (2013.01); *H01L 27/088* (2013.01); *H01L 29/41758* (2013.01); *H01L 29/41766* (2013.01); *H01L 29/41775* (2013.01); *H01L 29/41783* (2013.01)

(58) Field of Classification Search
CPC ........... H01L 21/823437; H01L 27/088; H01L 29/41758; H01L 29/41766; H01L 29/41775; H01L 29/41783; H01L 29/42356
USPC ........................................................ 257/401
See application file for complete search history.

(56) References Cited

U.S. PATENT DOCUMENTS

| 7,986,184 | B2 | 7/2011 | Besling et al. |
|---|---|---|---|
| 8,956,938 | B2* | 2/2015 | Cheng ............... H01L 29/41783 438/238 |
| 9,543,435 | B1* | 1/2017 | Basker .................. H01L 29/785 |
| 9,647,113 | B2* | 5/2017 | Cheng ................... H01L 29/785 |
| 2016/0379886 | A1* | 12/2016 | Kim ..................... H01L 29/6653 438/283 |
| 2020/0058559 | A1* | 2/2020 | Yoo ................. H01L 21/823468 |
| 2020/0373410 | A1* | 11/2020 | Lee .................... H01L 21/28568 |
| 2020/0388540 | A1* | 12/2020 | Gu ....................... H01L 29/1079 |
| 2020/0411689 | A1* | 12/2020 | Aquilino ........... H01L 29/66613 |

* cited by examiner

*Primary Examiner* — Matthew E Warren
(74) *Attorney, Agent, or Firm* — David Cain

(57) ABSTRACT

A semiconductor device is provided that includes a substrate, an active region, a pair of gates, a plurality of semiconductor structures and a plurality of pillar structures. The active region is over the substrate. The pair of gates is formed over the active region, and each gate of the pair of gates includes a gate structure and a pair of spacer structures disposed on sidewalls of the gate structure. The plurality of semiconductor structures is arranged between the pair of gates in an alternating arrangement configuration having a first width and a second width. The first width is substantially equal to a width of the gate structure. The plurality of semiconductor structures is separated by the plurality of pillar structures.

20 Claims, 15 Drawing Sheets

SEMICONDUCTOR STRUCTURES IN A WIDE GATE PITCH REGION OF SEMICONDUCTOR DEVICES

FIELD OF THE INVENTION

The disclosed subject matter relates generally to semiconductor devices, and more particularly to semiconductor devices having a plurality of semiconductor structures in a wide gate pitch region and methods of forming the same.

BACKGROUND

For every field effect transistor (FET) device, there will be three terminals—a gate, a source region and a drain region. FET devices control the flow of current by an application of a voltage to the gate, which in turn alters the conductivity of the source and the drain regions.

In an active region of a semiconductor device, the source and drain regions may be formed by a doping process or by an epitaxy process to form semiconductor structures. The formation of semiconductor structures may suffer an undesirable inherent effect, known as a pattern loading effect. The pattern loading effect occurs during the simultaneous growth of semiconductor material in regions having a higher pattern density and regions having a lower pattern density, leading to a difference in growth rates of the semiconductor structures.

As a result of a difference in growth rates in these different regions, the amount of semiconductor material grown can differ, and this causes non-uniformity in thicknesses of the resulting semiconductor structures. For example, a higher pattern density region with smaller areas for growth of semiconductor material may have a higher growth rate than that of a lower pattern density region. This non-uniformity of semiconductor structures makes process control challenging and the FET device performance may be adversely affected.

Therefore, there is a need to provide semiconductor devices having a plurality of semiconductor structures in a wide gate pitch region and methods of forming the same that can overcome, or at least ameliorate, the disadvantage as described above.

SUMMARY

To achieve the foregoing and other aspects of the present disclosure semiconductor devices having a plurality of semiconductor structures in a wide gate pitch region and methods of forming the same are presented.

According to an aspect of the disclosure, a semiconductor device is provided that includes a substrate, an active region, a pair of gates, a plurality of semiconductor structures and a plurality of pillar structures. The active region is over the substrate. The pair of gates is formed over the active region, and each gate of the pair of gates includes a gate structure and a pair of spacer structures disposed on sidewalls of the gate structure. The plurality of semiconductor structures is arranged between the pair of gate structures in an alternating arrangement configuration having a first width and a second width. The first width is substantially equal to a width of the gate structure. The plurality of semiconductor structures is separated by the plurality of pillar structures.

According to another aspect of the disclosure, a semiconductor device is provided that includes a substrate, an active region, a pair of gates, a plurality of semiconductor structures, a plurality of pillar structures and semiconductor cap layers. The active region is over the substrate. The pair of gates is formed over the active region, and each gate of the pair of gates includes a gate structure and a pair of spacer structures disposed on sidewalls of the gate structure. The plurality of semiconductor structures is arranged between the pair of gate structures in an alternating arrangement configuration having a first width and a second width. The first width is substantially equal to a width of the gate structure. The plurality of semiconductor structures is separated by the plurality of pillar structures. A semiconductor cap layer is over each pillar structure of the plurality of pillar structures and bridging a first semiconductor structure having the first width and a second semiconductor structure having the second width.

According to yet another aspect of the disclosure, a method of forming structures in a semiconductor device is provided that includes providing a substrate and forming an active region over the substrate. A pair of gates is formed over the active region, wherein forming each gate of the pair of gates includes forming a gate structure and forming a pair of spacer structures on sidewalls of the gate structure. A plurality of semiconductor structures and a plurality of pillar structures are formed between the pair of gates. The plurality of semiconductor structures is arranged in an alternating arrangement configuration having a first width and a second width. The first width is substantially equal to a width of the gate structure. The plurality of semiconductor structures is separated by the plurality of pillar structures.

BRIEF DESCRIPTION OF THE DRAWINGS

The present disclosure may be understood by reference to the following description taken in conjunction with the accompanying drawings.

FIGS. 2-9, with suffix "A", are cross-sectional views at a device region along a similar line A-A' as illustrated in FIG. 1. FIGS. 2-9, with suffix "B", are cross-sectional views at a device region along a similar line B-B' as illustrated in FIG. 1.

Figure 1A:
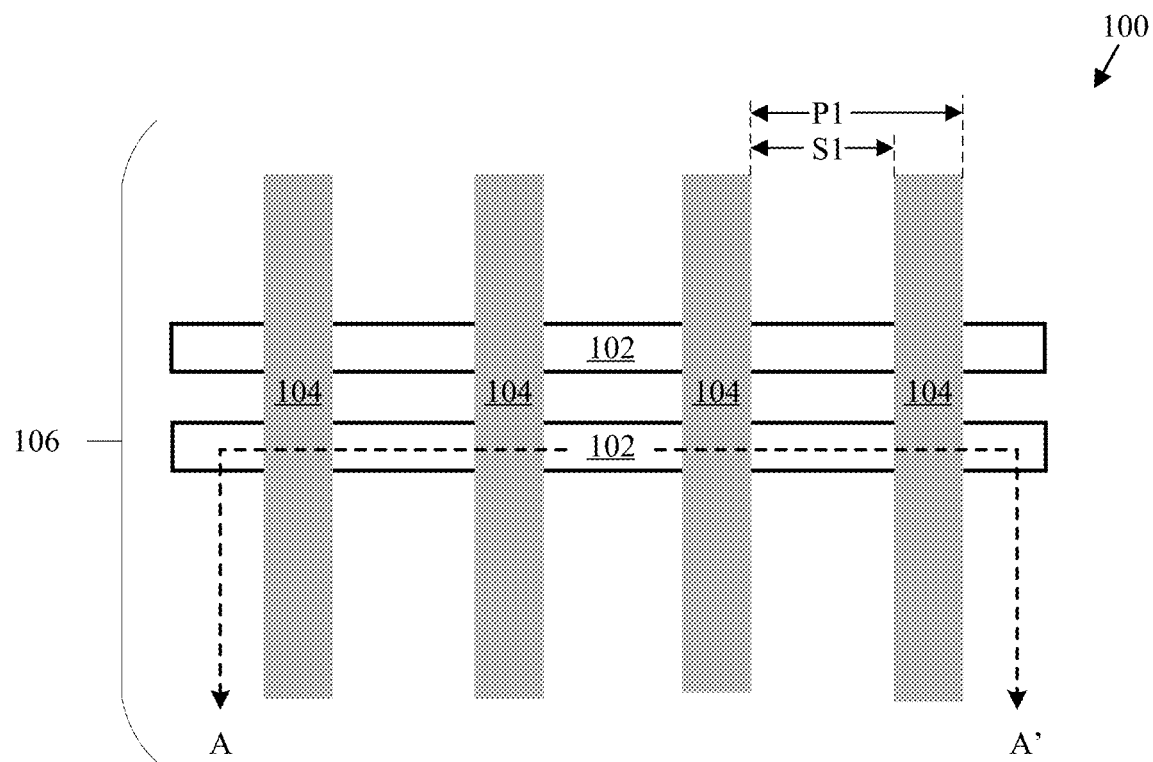
FIGS. 1A and 1B are simplified top views of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

The disclosure relates to semiconductor devices having a plurality of semiconductor structures; in particular, the semiconductor structures in a wide gate pitch region and methods of forming the same. The semiconductor devices may be complementary metal-oxide-semiconductor (CMOS) devices including P-type metal-oxide-semiconductor (PMOS) devices and/or N-type metal-oxide-semiconductor (NMOS) devices. It is understood that the following disclosure is not limited to any particular type of semiconductor device. The methods disclosed herein may be applied to any type of semiconductor device, such as tri-gate field effect transistor (FET) devices, fin-type FET (FinFET) devices or planar-type metal-oxide-semiconductor FET (MOSFET) devices.

Gates of the semiconductor devices may be fabricated with a gate-first, a gate-last or a hybrid fabrication process. In the gate-first process, conductive layers, formed over active regions, may be patterned to form gate structures. This process step may be followed by conventional CMOS processing, including formation of source and drain regions, formation of spacer structures and deposition of inter-level dielectric (ILD) material. The gates of the semiconductor device may include the gate structures and the spacer structures. In the gate-last process, dummy gate structures may be formed and followed by conventional CMOS processing, including formation of the source and drain regions, formation of spacer structures and deposition of ILD material. Thereafter, the dummy gate structures may be replaced with replacement gate structures. The gates of the semiconductor device may include the replacement gate structures and the spacer structures. In the hybrid fabrication process, a gate structure of a first device may be formed using a first fabrication process and a gate structure of a second device may be formed using a second fabrication process.

The term "gate pitch" as used herein defines a distance from a left edge of a gate to a left edge of an adjacent gate. The minimum gate pitch in a semiconductor device is termed "contacted poly pitch" (CPP), with a corresponding minimum gate spacing. The term "gate spacing," as used herein, defines a distance between two adjacent gates. The term "wide gate pitch," as used herein, defines a gate pitch wider than 1×CPP of the semiconductor device, for example, 1.3×CPP, 2×CPP or 3×CPP.

Embodiments of the present disclosure are now described in detail with accompanying drawings. It is noted that like and corresponding elements are referred to by the use of the same reference numerals. However, it is noted that specific elements may be denoted by a reference numeral and a suffix, for example 104a, 206b, etc. When those elements are referred to generically, merely the reference numerals are used, for example 104, 206, etc.

Figure 1B:
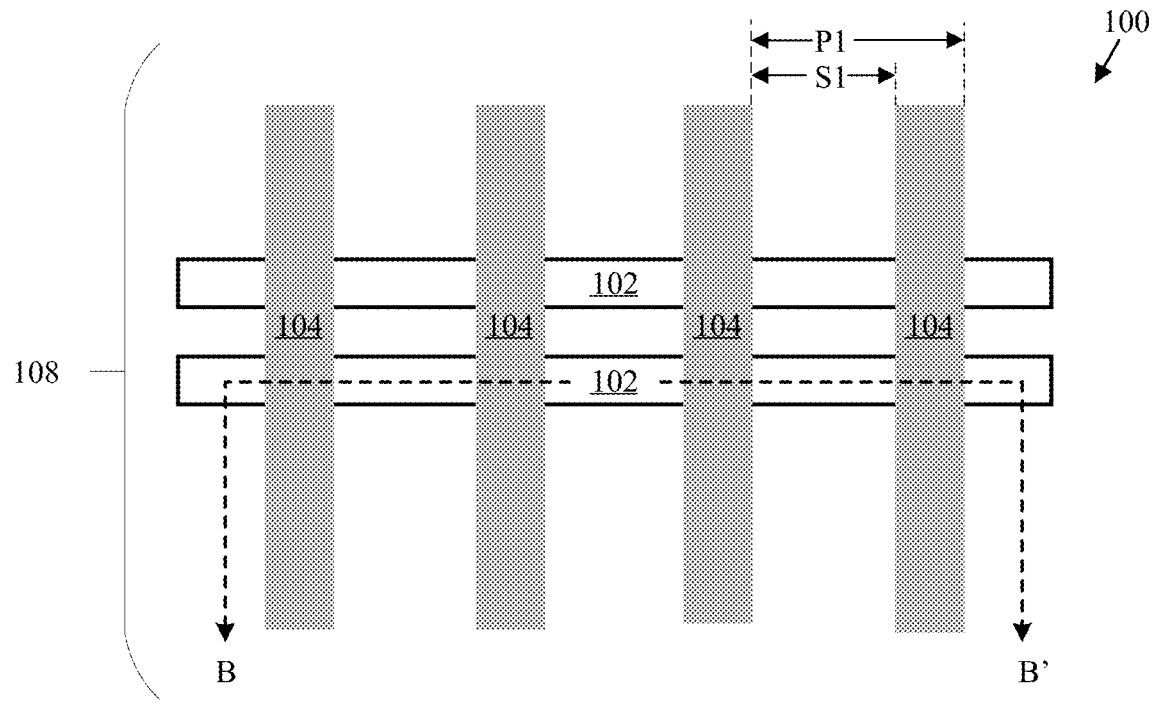

FIGS. 1A-1B are simplified top views of a semiconductor device 100, according to an embodiment of the disclosure. The semiconductor device 100 may include an array of active regions 102 and an array of gates 104 traversing across the array of active regions 102. The active regions 102 may function as a channel for current flow. The active regions 102 may have various shapes depending on the device architecture. For example, the active regions 102 in this embodiment are raised channels, which are shaped like fins, over a semiconductor substrate (not shown). Furthermore, it is understood that even though the active regions 102 are represented as "fins" in the accompanying drawings, the fin is used only as a non-limiting example of the active region, and other architectural forms of the active regions (e.g., a doped layer on a top surface of a bulk semiconductor substrate or a semiconductor-on-insulator layer) may be used as well.

The array of gates 104 has a gate width. The array of gates 104 has a gate pitch P1 between the adjacent gates 104, with a corresponding gate spacing S1. In this embodiment of the disclosure, the gate pitch P1 has a width that is equal to the CPP of the semiconductor device 100, with a corresponding minimum gate spacing of the semiconductor device 100.

As illustrated in FIGS. 1A and 1B, the semiconductor device 100 includes a first device region 106 and a second device region 108. The first and the second device regions (106 and 108, respectively) are device regions designed to have a wide gate pitch. The first device region 106 may become a device region having a gate pitch of 2×CPP and the second device region 108 may become a device region having a gate pitch of 3×CPP. It is understood that the first device region 106 and the second device region 108 may be formed together or separately, without departing from the spirit or essential characteristics of the disclosure.

Those skilled in the art would recognize that the number and placement locations of the active regions 102 and the gates 104 may vary according to the specific designs of the semiconductor devices. It is understood that there may be other gates having different gate pitches formed on different regions of the semiconductor device. For example, the different gate pitches may include widths of 1.3×CPP and 4×CPP. Those gates are not shown in the accompanying drawings.

FIGS. 2-10, with suffix "A", are cross-sectional views of a partially processed semiconductor device 200 at a device region (taken in a similar first device region 106, along a similar line A-A' in FIG. 1A), illustrating a method of forming a plurality of semiconductor structures in a wide gate pitch region, according to an embodiment of the disclosure.

FIGS. 2-10, with suffix "B", are cross-sectional views of the partially processed semiconductor device 200 at another device region (taken in a similar second device region 108, along a similar line B-B' in FIG. 1B), illustrating a method of forming a plurality of semiconductor structures in a wide gate pitch region, according to another embodiment of the disclosure.

Figure 2A:
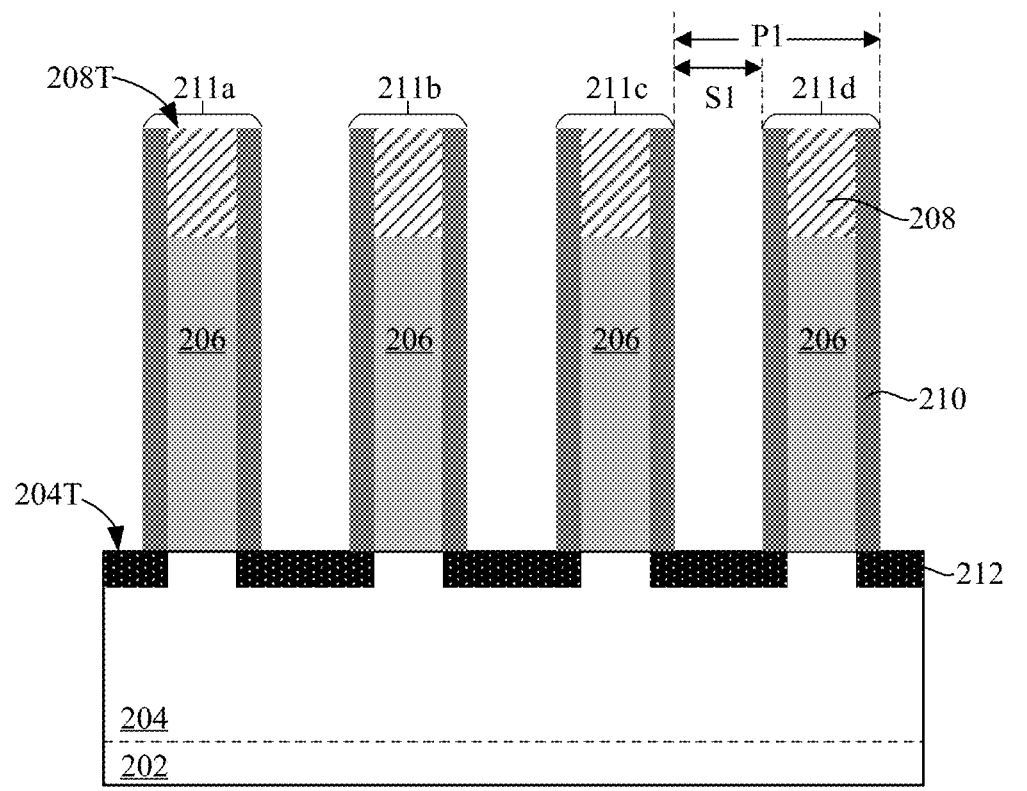
FIGS. 2A to 10B are cross-sectional views of a partially processed semiconductor device, illustrating various stages of forming a plurality of semiconductor structures in a wide gate pitch region, according to an embodiment of the disclosure.
Figure 2B:
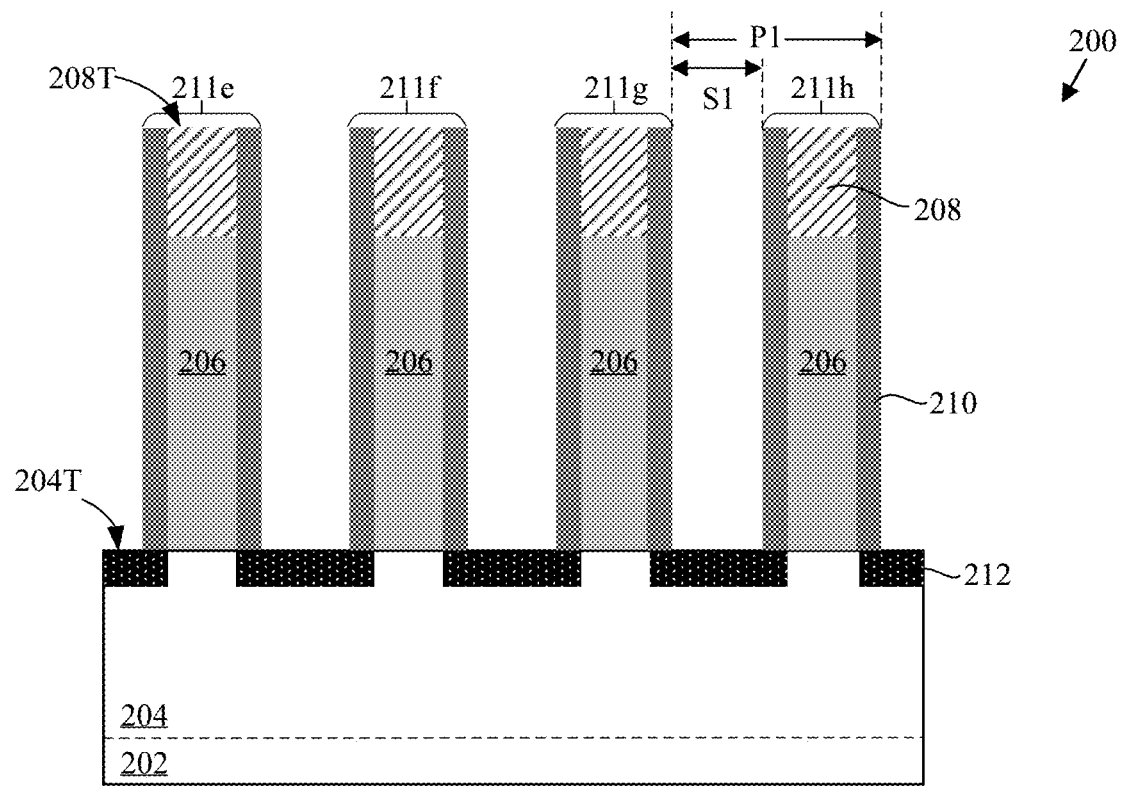

Referring to FIG. 2A and FIG. 2B, the semiconductor device 200 may include a semiconductor substrate 202 and an active region 204 formed over the substrate 202. The active region 204 is typically formed of the same semiconductor material as the substrate 202, and an arbitrary intersection between the substrate 202 and the active region 204 is demarcated by a dashed line. The active region 204 has a top surface 204T. The semiconductor substrate 202 may include any suitable semiconductor material, such as silicon, silicon germanium, silicon carbide, other II-VI or III-V semiconductor compounds and the like. In an embodiment of the disclosure, the semiconductor material of the substrate 202 is preferably silicon.

An array of gates 211 may be formed over the active region 204 by an exemplary process described herein. A layer of gate material (not shown) may be deposited over the active region 204. An array of gate structures 206 may be formed by depositing a patterning layer (not shown) over the gate material and forming openings (not shown) in the patterning layer (not shown) using suitable deposition and lithographic processes. The patterning layer (not shown) forms gate-defining masking portions 208 over the gate material (not shown) and the array of gate structures 206 may be formed by removing portions of the gate material (not shown) between regions covered by the gate-defining masking portions 208. Each of the gate structures has a gate structure width. The patterning layer (not shown) may include a hard mask layer, a photoresist layer, or any suitable patterning layer having any suitable thickness. The patterning layer (not shown) may also include a multi-layer stack of patterning materials.

It is desirable and advantageous to form the array of gate structures having a substantially uniform gate pitch because concurrently forming gate structures having different gate pitches creates undesirable process variations. For example, during the lithographic process to form the gate structure patterns having different gate pitches, the lithographic tool may not be capable of simultaneously patterning the different gate pitches satisfactorily due to focusing limitations. Additionally, during the material removal process to form the gate structures, the material removal rate is dependent on the pattern density due to a micro loading effect. The material removal rate in a low pattern density region, i.e., in a wide gate pitch region, is higher than that in a high pattern density region, thereby resulting in non-uniformity of the gate structures. Process parameters selected in the fabrication steps may not be optimal, as compromises may be necessary to control the process variation adequately.

A plurality of spacer structures 210 may be formed on sidewalls of the gate structures 206 and each of the spacer structures 210 has a spacer structure width. The plurality of spacer structures 210 may be formed using known semiconductor fabrication processes, including the following exemplary process.

A dielectric liner (not shown) may be conformally deposited over the top surface 204T of the active region 204, on the sidewalls of the gate structures 206 and over the gate-defining masking portions 208 using a suitable deposition process, such as a chemical vapor deposition (CVD) process. The dielectric liner (not shown) may be formed of a low-k dielectric material, i.e., a dielectric material having a low dielectric constant, to contribute to electrically isolating the gate structures 206 from adjacent conductive structures. The dielectric liner (not shown) may include silicon nitride, silicon oxide or other suitable low-k dielectric material having a suitable thickness. In an embodiment of the disclosure, the dielectric liner is preferably a silicon nitride liner. The dielectric liner (not shown) may be anisotropically removed using a suitable material removal process to form a pair of spacer structures 210 on the sidewalls of each of the gate structures 206. The spacer structures 210 may have substantially vertical sidewalls. The gate structures 206 and the pair of spacer structures 210 form the array of gates 211 of the semiconductor device 200, and each of the gates 211 has a gate width. Portions of the active region 204 between the array of gates 211 and top surfaces 208T of the gate-defining masking portions 208 may be exposed after forming the spacer structures 210.

A plurality of doped regions 212 may be formed in the exposed portions of the active region 204, using a suitable doping process. The plurality of the doped regions 212 may be formed in upper portions of the active regions and may have top surfaces extending to the top surface of the active region 204T. The plurality of doped regions 212 may be also formed under the plurality of spacer structures 210. The doping process may use any suitable dopants to obtain a desired dopant concentration. In this embodiment of the disclosure, the plurality of doped regions 212 forms lightly-doped drain (LDD) regions of the semiconductor device 200. A suitable anneal process may be performed on the plurality of doped regions 212 to "activate" the LDD regions.

Each of the gates 211 is separated from an adjacent gate 211 by a gate pitch P1 with a corresponding gate spacing S1. In this embodiment of the disclosure, the gate pitch P1 is equal to the CPP of the semiconductor device 200, and the corresponding gate spacing S1 is equal to the minimum gate spacing of the semiconductor device 200. In an embodiment of the disclosure, the array of gates 211 may include a polysilicon gate structure and a pair of spacer structures, which may be fabricated by a gate-last process. In another embodiment of the disclosure, the array of gates 211 may include a metal gate structure and a pair of spacer structures, which may be fabricated by a gate-first process.

Figure 3A:
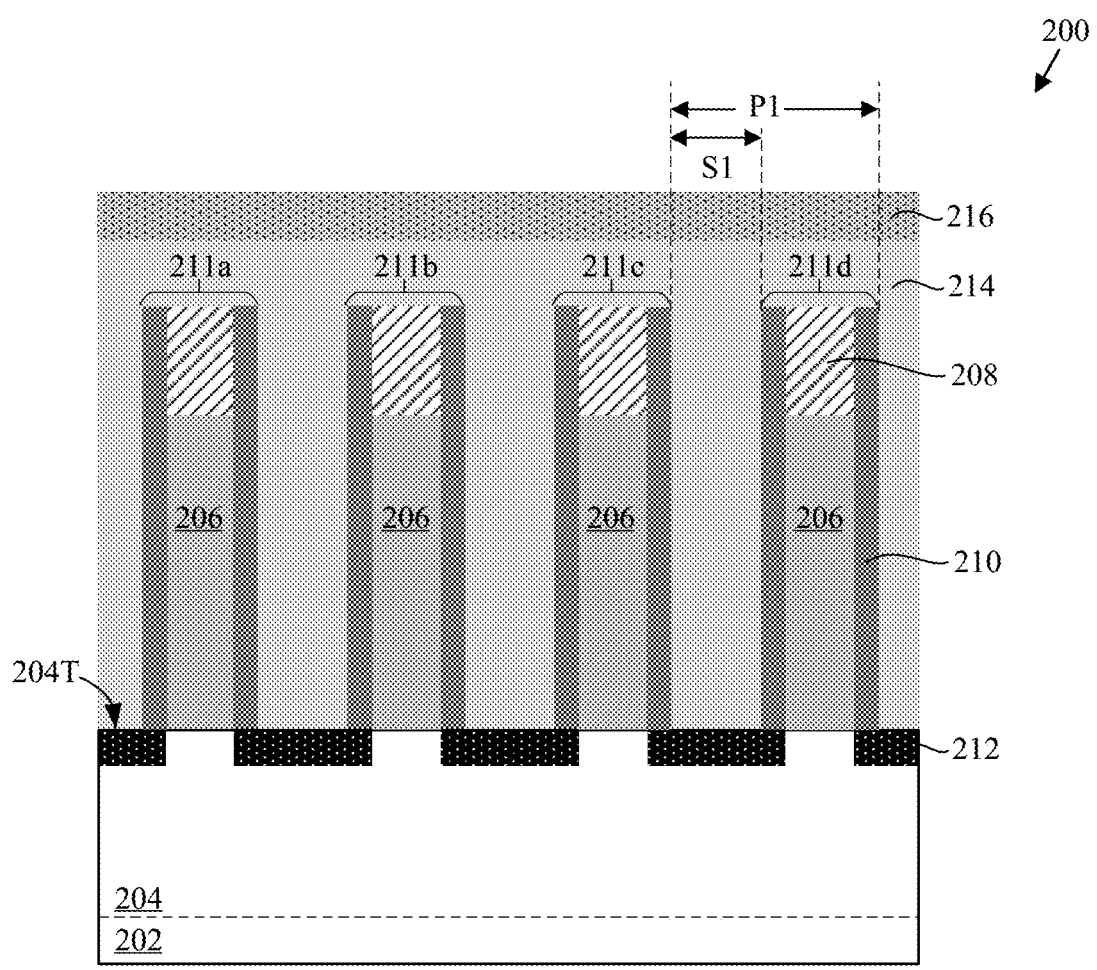
Figure 3B:
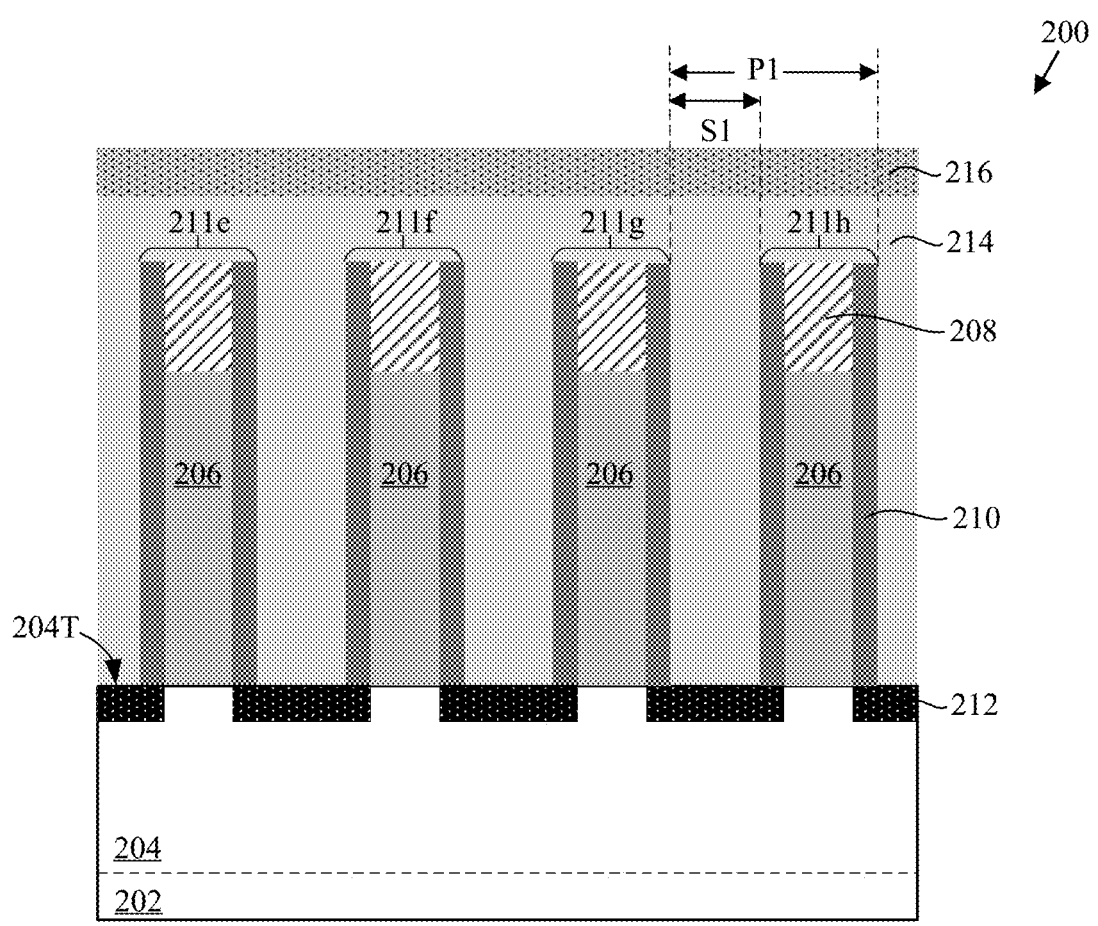

Referring to FIG. 3A and FIG. 3B (FIG. 3A continues from the embodiment shown in FIG. 2A, and FIG. 3B continues from the embodiment shown in FIG. 2B), a patterning layer 214 and a masking layer 216 are deposited over the semiconductor device 200. The patterning layer 214 may be deposited between and over the array of gates 211, and thereafter, the masking layer 216 may be deposited over the patterning layer 214 using a suitable deposition process, such as a chemical vapor deposition (CVD) process. The patterning layer 214 may include an organic planarization layer (OPL). The masking layer 216 may include an oxide layer, a nitride layer, an oxynitride layer or other suitable masking layers having suitable thicknesses.

Figure 4A:
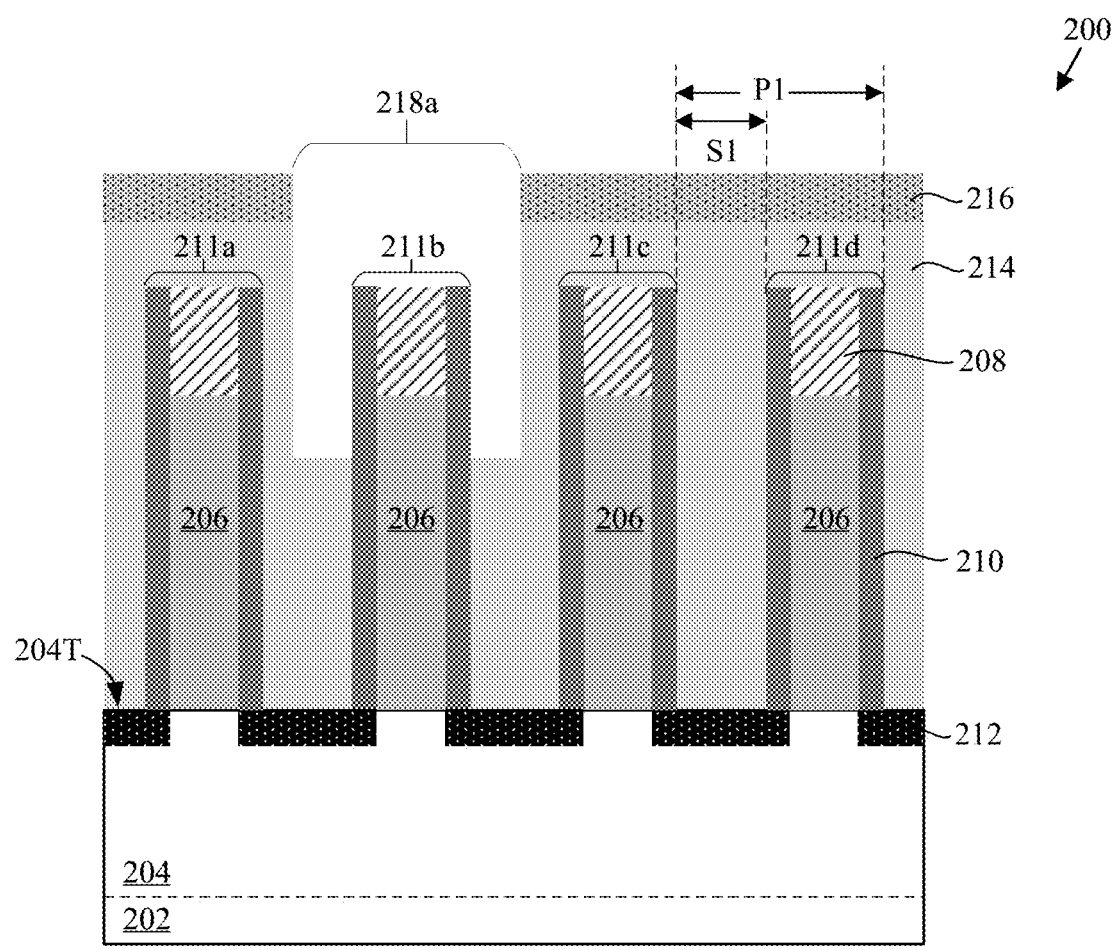
Figure 4B:
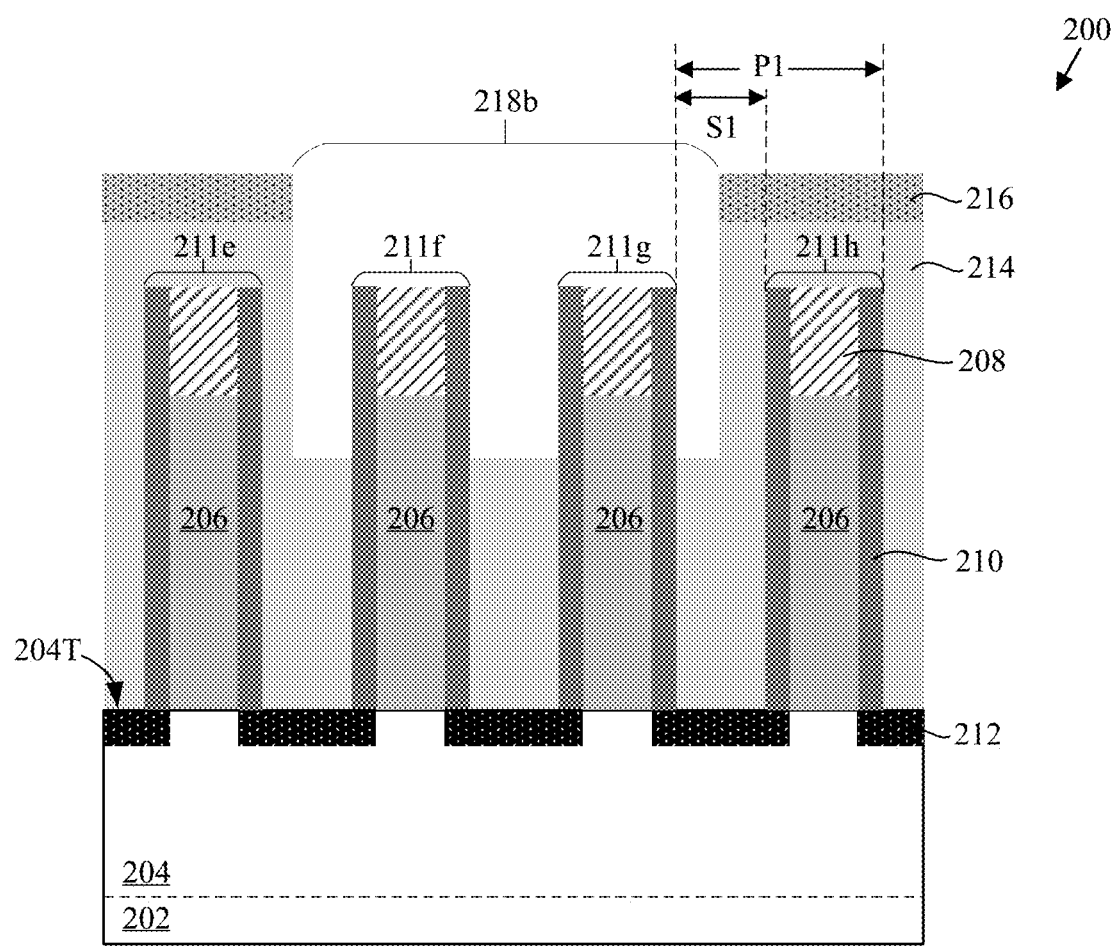

Referring to FIG. 4A and FIG. 4B (FIG. 4A continues from the embodiment shown in FIG. 3A, and FIG. 4B continues from the embodiment shown in FIG. 3B), patterned openings 218 are formed, exposing the gates 211 in the patterned openings 218. A patterned opening 218a exposes one gate 211b in FIG. 4A and a patterned opening 218b exposes two adjacent gate 211f and 211g in FIG. 4B. The patterned openings 218a and 218b may be formed using a suitable material removal process, and upper portions of the gates 211b, 211f and 211g are exposed in the patterned openings 218.

Figure 5A:
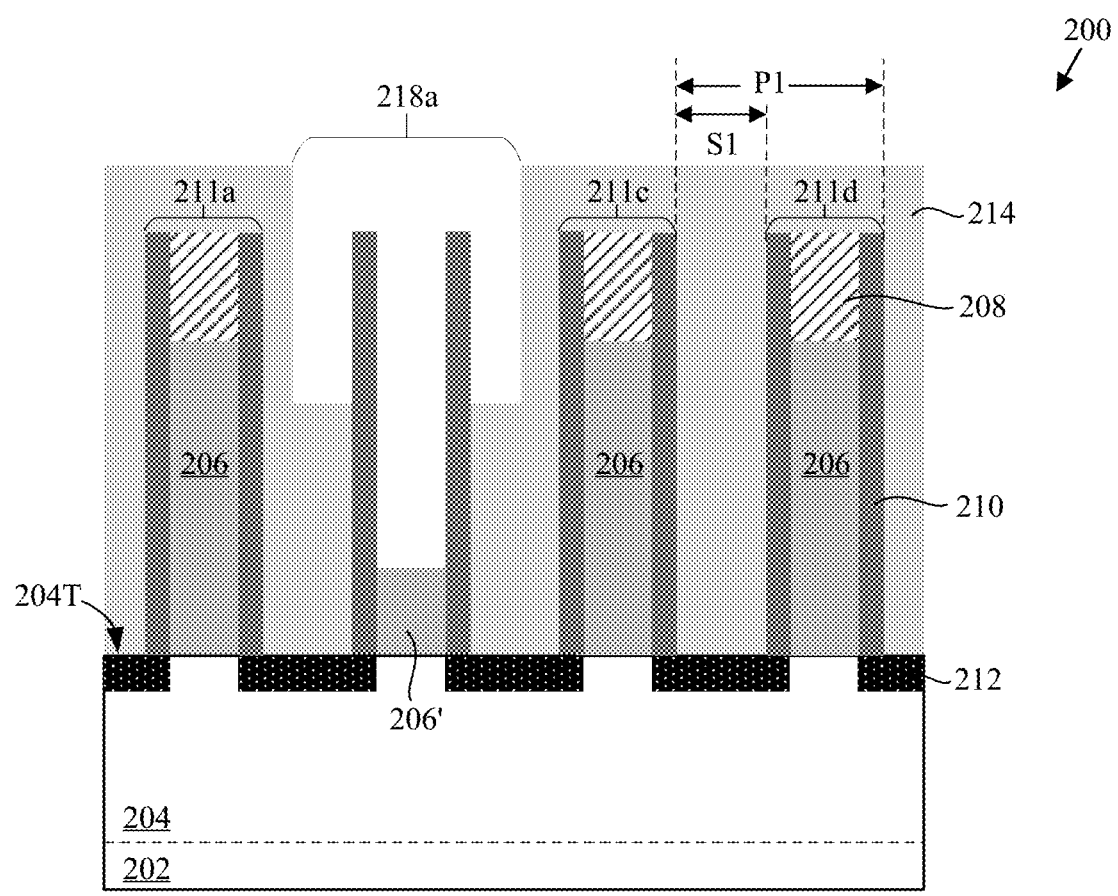
Figure 5B:
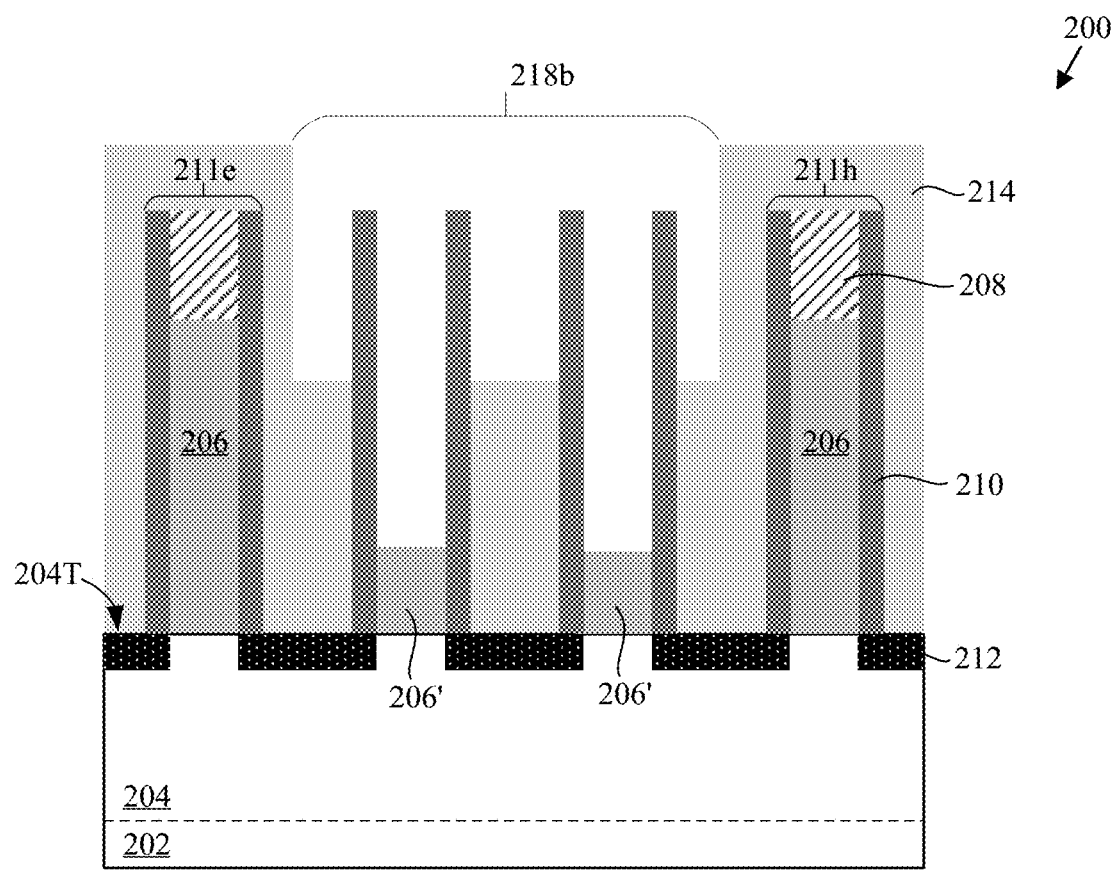

The number of gates to be exposed in a patterned opening may depend on the gate pitch requirement at a particular device region. For example, to form a pair of gates separated by a wide gate pitch of 2×CPP, one gate may be exposed in the patterned opening, as illustrated in FIG. 5A. In another example, to form a pair of gates separated by a wide gate pitch of 3×CPP, two adjacent gates may be exposed in the patterned opening, as illustrated in FIG. 5B. The gate(s) exposed in the patterned openings will subsequently form a mask gate structure(s) at later fabrication steps.

Referring to FIG. 5A and FIG. 5B (FIG. 5A continues from the embodiment shown in FIG. 4A, and FIG. 5B continues from the embodiment shown in FIG. 4B), the gate 211b exposed in the patterned opening 218a and the gates 211f and 211g exposed in the patterned opening 218b may have their respective gate structures 206 recessed by removing the gate-defining masking portions 208 and partially removing the gate structures 206 to form mask gate structures 206', using a suitable material removal process. The masking layer 216 may be consequently removed during the material removal process. In an embodiment of the disclosure, the mask gate structures 206' have a height ranging from about 10 nm to about 20 nm.

Figure 6A:
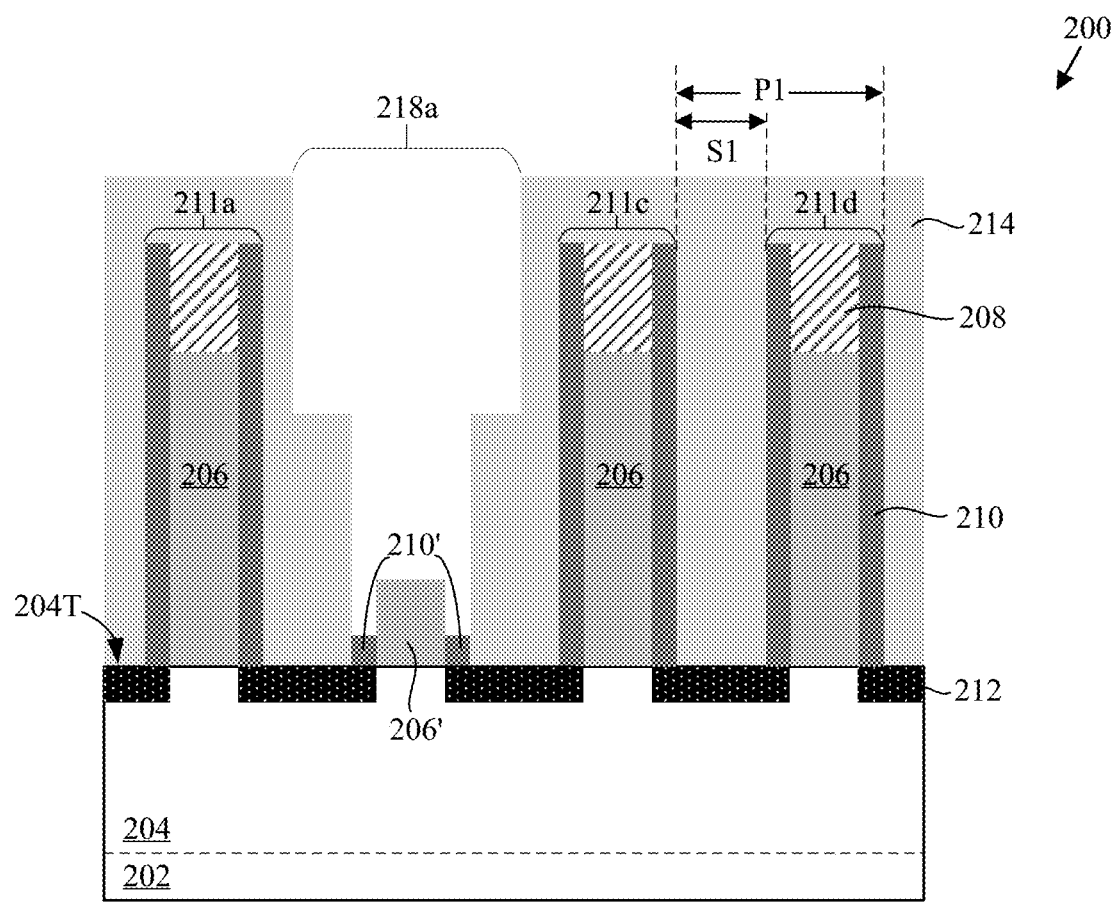
Figure 6B:
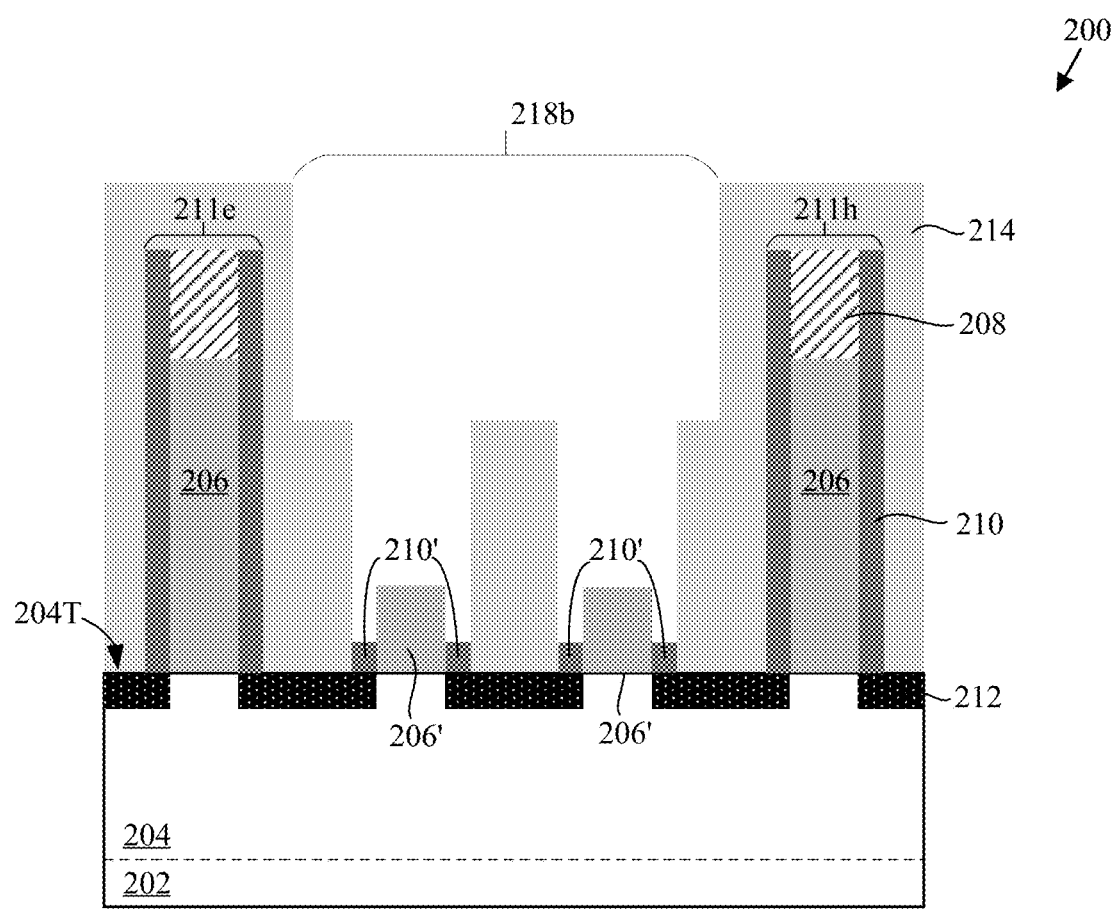

Referring to FIG. 6A and FIG. 6B (FIG. 6A continues from the embodiment shown in FIG. 5A, and FIG. 6B continues from the embodiment shown in FIG. 5B), mask spacer structures 210' are formed in the patterned openings 218a and 218b. As illustrated in FIG. 6A, the spacer structures 210 exposed in the patterned opening 218a may be recessed to a level below the mask gate structures 206' using a suitable material removal process to form the mask spacer structures 210'. Likewise as illustrated in FIG. 6B, the spacer structures 210 exposed in the patterned opening 218b may be recessed to a level below the mask gate structures 206' during the same material removal process to form the mask spacer structures 210'. The mask spacer structures 210' have substantially equal widths as the spacer structures 210. By using mask gate structures 206' and the adjacent patterning layer 214 as masking features, the mask spacer structures 210' may retain their substantially vertical sidewalls and may have the same width as the spacer structures 210 of the remaining gates 211.

Figure 7A:
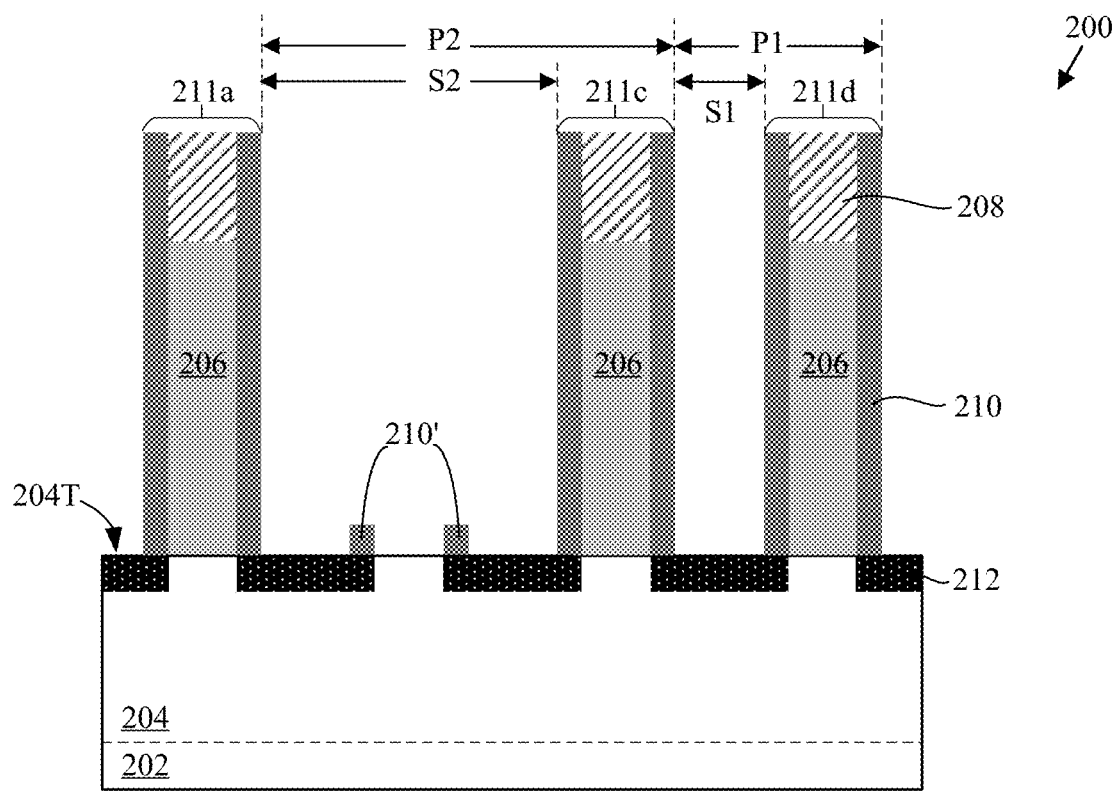
Figure 7B:
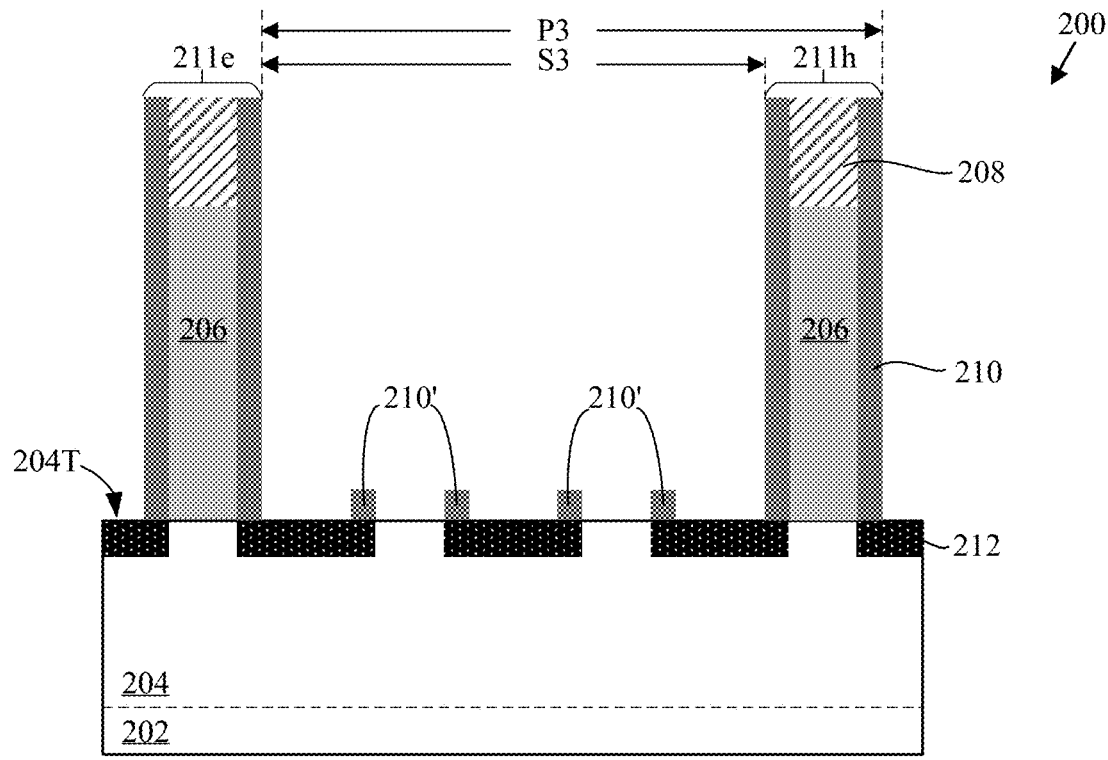

Referring to FIG. 7A and FIG. 7B (FIG. 7A continues from the embodiment shown in FIG. 6A, and FIG. 7B continues from the embodiment shown in FIG. 6B), the top surface 204T of the active region 204 may be exposed by removing the mask gate structures 206' using a suitable material removal process. The mask spacer structures 210' are retained after removing the mask gate structures 206'. The patterning layer 214 may be subsequently removed using another suitable material removal process. The material removal process employed to remove the patterning layer 214 may include a dry plasma ashing process, a selective wet etching process or other suitable material removal processes.

As illustrated in FIG. 7A, the gate 211a is separated from the adjacent gate 211c by a gate pitch P2, with a corresponding gate spacing S2. The gate pitch P2 has a width that is substantially equal to 2×CPP of the semiconductor device 200. Further illustrated in FIG. 7B, the gate 211e is separated from the adjacent gate 211h by a gate pitch P3, with a corresponding gate spacing S3. The gate pitch P3 has a width that is substantially equal to 3×CPP of the semiconductor device 200. The gate spacing S2 and the gate spacing S3 are wider than the minimum gate spacing S1 of the semiconductor device 200.

Figure 8A:
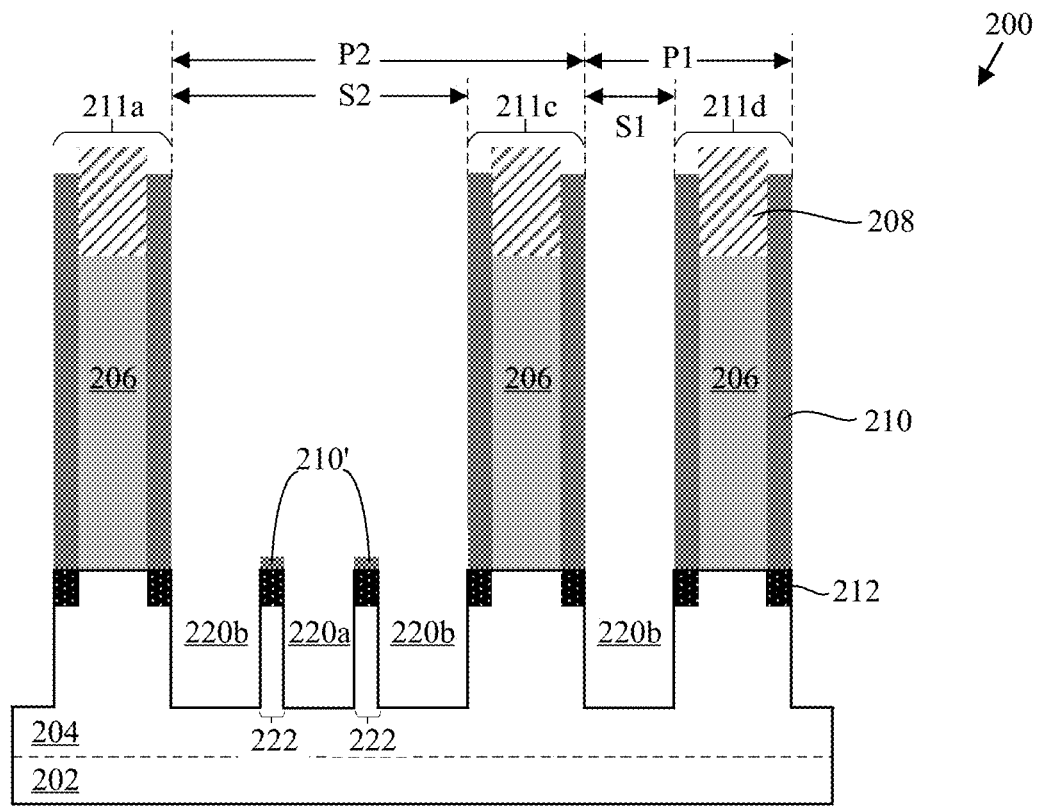
Figure 8B:
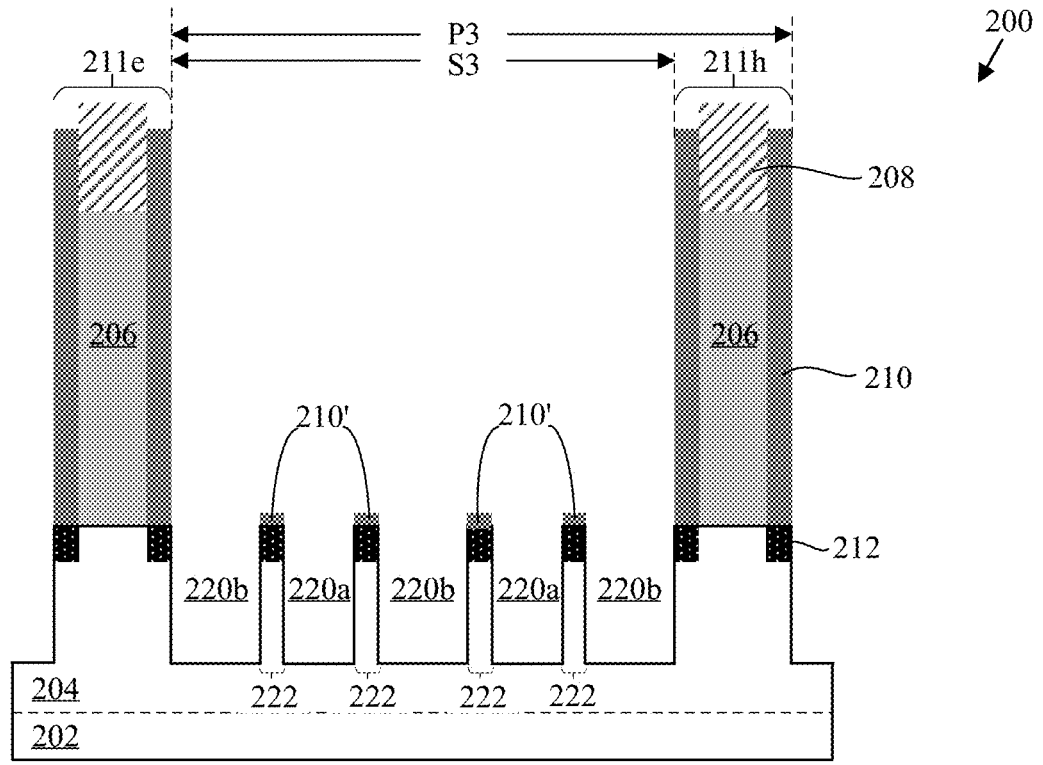

Referring to FIG. 8A and FIG. 8B (FIG. 8A continues from the embodiment shown in FIG. 7A, and FIG. 8B continues from the embodiment shown in FIG. 7B), a plurality of cavities 220 is formed in the active region 204. Using the gates 211 and the mask spacer structures 210' as masking features, the plurality of cavities 220 may be formed by removing material from the active region 204, using a suitable material removal process, including the exposed portions of the doped regions 212. Cavity formation in the active region is performed by known techniques in the art.

The plurality of cavities 220 formed may be odd-numbered and may have an alternating arrangement configuration of a first cavity width and a second cavity width. In some embodiments, the plurality of cavities 220 may include a first cavity 220a having the first cavity width that is substantially equal to the gate width and a second cavity 220b having the second cavity width that is substantially equal to the minimum gate spacing S1 of the semiconductor device 200. For example, as illustrated in FIG. 8A, three cavities 220, formed in the active region 204 between the gates 211a and 211c, are arranged in a 220b-220a-220b alternating arrangement configuration. In another example, as illustrated in FIG. 9B, five cavities 220, formed in the active region 204 between the gates 211e and 211h, are arranged in a 220b-220a-220b-220a-220b alternating arrangement configuration. Although the first cavity 220a is illustrated to have a narrower width than the second cavity 220b in FIG. 9A and FIG. 9B, the first cavity 220a may have a narrower width, a wider width or an equal width with respect to the second cavity 220b.

A plurality of pillar structures 222 is correspondingly formed in the active region 204 during the formation of the plurality of cavities 220. The plurality of pillar structures 222 formed may be even-numbered. For example, two pillar structures are formed in FIG. 9A and four pillar structures are formed in FIG. 9B. Each of the pillar structures 222 has a pillar structure width that is substantially equal to the width of the mask spacer structures 210'. The plurality of pillar structures 222 advantageously provides additional surface planes in a wide gate pitch region of the active region 204 for semiconductor material to grow. Local pattern density is thereby increased in that region to eliminate, or at least reduce, the pattern loading effect during the subsequent formation of the semiconductor structures. Upper portions of the pillar structures 222 may include the portions of doped regions 212 covered by the mask spacer structures 210'.

During the material removal process to form the plurality of cavities 220, top portions of the spacer structures 210 may be consequently removed. The mask spacer structures 210' above the pillar structures 222 may be further thinned during the material removal process. In an embodiment of the disclosure, the material removal process employed to form the plurality of cavities 220 is preferably an anisotropic dry etching process, such as a reactive ion etching (ME) process.

Figure 9A:
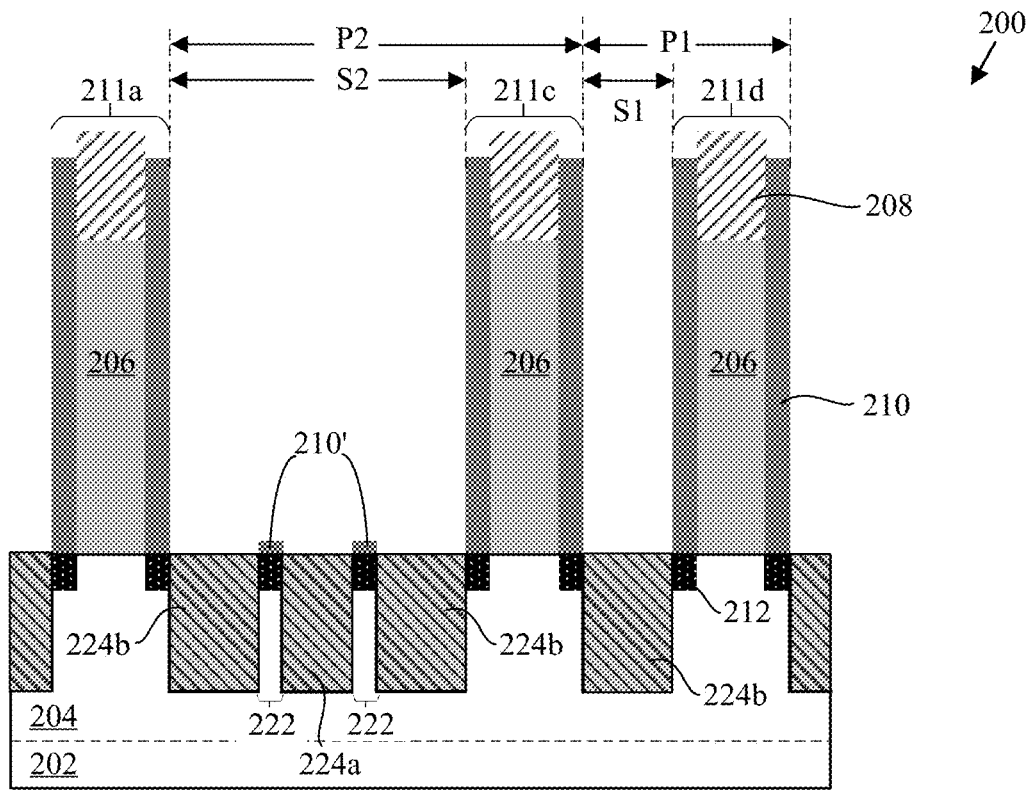
Figure 9B:
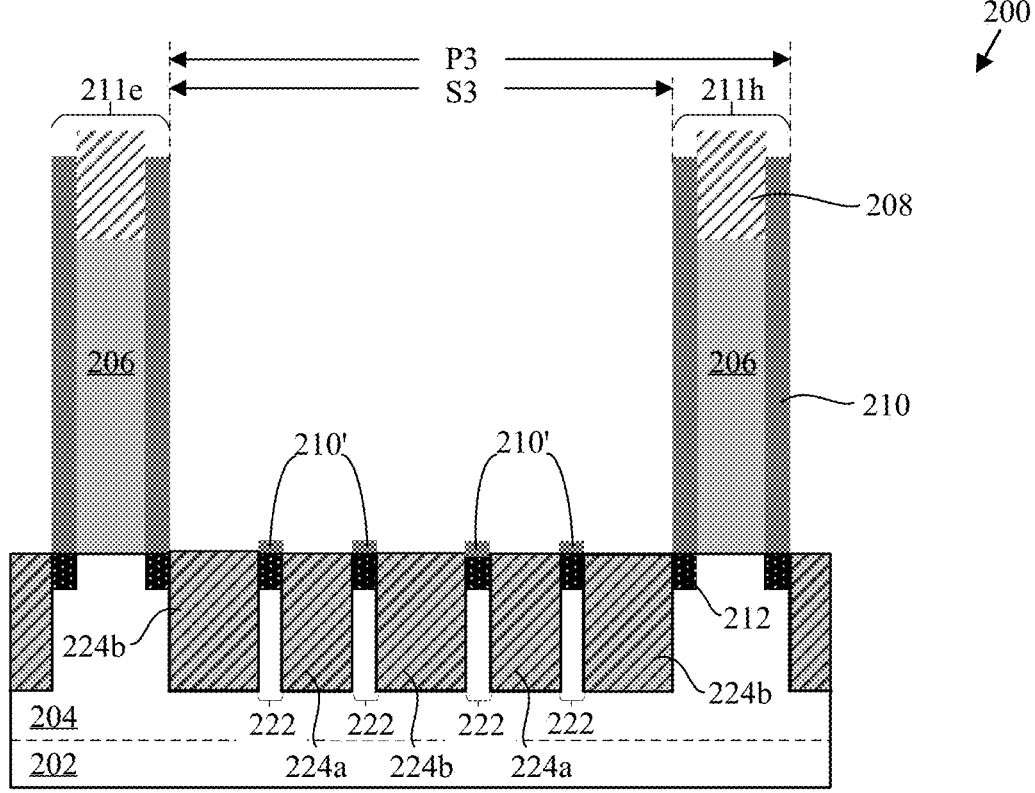

Referring to FIG. 9A and FIG. 9B (FIG. 9A continues from the embodiment shown in FIG. 8A, and FIG. 9B continues from the embodiment shown in FIG. 8B), a plurality of semiconductor structures 224 is formed in the plurality of cavities 220, where the plurality of semiconductor structures 224 has an alternating arrangement configuration of a first width and a second width.

The plurality of semiconductor structures 224 may be formed by filling the plurality of cavities 220 with a semiconductor material. For example, the plurality of cavities 220 may be filled by growing a semiconductor material using a suitable epitaxy process, such as vapor-phase epitaxy process, liquid-phase epitaxy process, solid-phase epitaxy process or other suitable epitaxy processes. The plurality of semiconductor structures 224 may be grown selectively over certain surfaces, e.g., over semiconductor surfaces, while other surfaces remain substantially free of semiconductor material. The selective growth of semiconductor material has known techniques in the art.

In this embodiment of the disclosure, the semiconductor material is grown in the first cavities 220a to form first semiconductor structures 224a having the first width and grown in the second cavities 220b to form second semiconductor structures 224b having the second width. The first width is substantially equal to the gate width. The second width is substantially equal to the minimum gate spacing S1 of the semiconductor device 200. The plurality of semiconductor structures 224 may abut the portions of doped regions 212 at the upper portions of the pillar structures 222.

The semiconductor material used to grow the plurality of semiconductor structures 224 may include silicon, silicon phosphorous, silicon phosphorous carbide, and/or other suitable combinations. In an embodiment of the disclosure where an NMOS device is desired, the plurality of semiconductor structures 224 may include epitaxially-grown silicon. In another embodiment of the disclosure, where a PMOS device is desired, the plurality of semiconductor structures 224 may include epitaxially-grown silicon germanium.

In an alternative embodiment of the disclosure, the plurality of semiconductor structures 224 may be doped with dopants. In one example, to form NMOS device regions, the plurality of semiconductor structures 224 may be doped with N-type donors. The N-type donors may include phosphorus, arsenic, antimony, and/or other suitable dopants. In another example, to form PMOS device regions, the plurality of semiconductor structures 224 may be doped with P-type acceptors. The P-type acceptors may include boron, aluminum, gallium, indium, and/or other suitable dopants. One or more annealing processes may be performed to activate the PMOS and NMOS device regions.

The annealing processes may include rapid thermal annealing (RTA) process, laser annealing process or other suitable annealing processes. Additional fabrication steps may be performed before, during or after forming the plurality of semiconductor structures 224, such as forming one or more patterning layers and/or dielectric layers as protection layers for regions that will not be doped. For example, when forming semiconductor structures in a PMOS device, one or more patterning layers and dielectric layers may be formed on an NMOS device as protection layers using suitable deposition processes.

The semiconductor device 200 may be subjected to a suitable cleaning process prior to performing an epitaxy process. The cleaning process may be performed using a variety of suitable etchants or cleaning agents, such as a dilute hydrofluoric acid. The cleaning process may remove any undesirable oxide material formed as a result of a natural oxidation of exposed active region surfaces in the cavities 220. In some embodiments of the disclosure, the cleaning process may not completely remove the mask spacer structures 210' above the pillar structures 222.

Figure 10A:
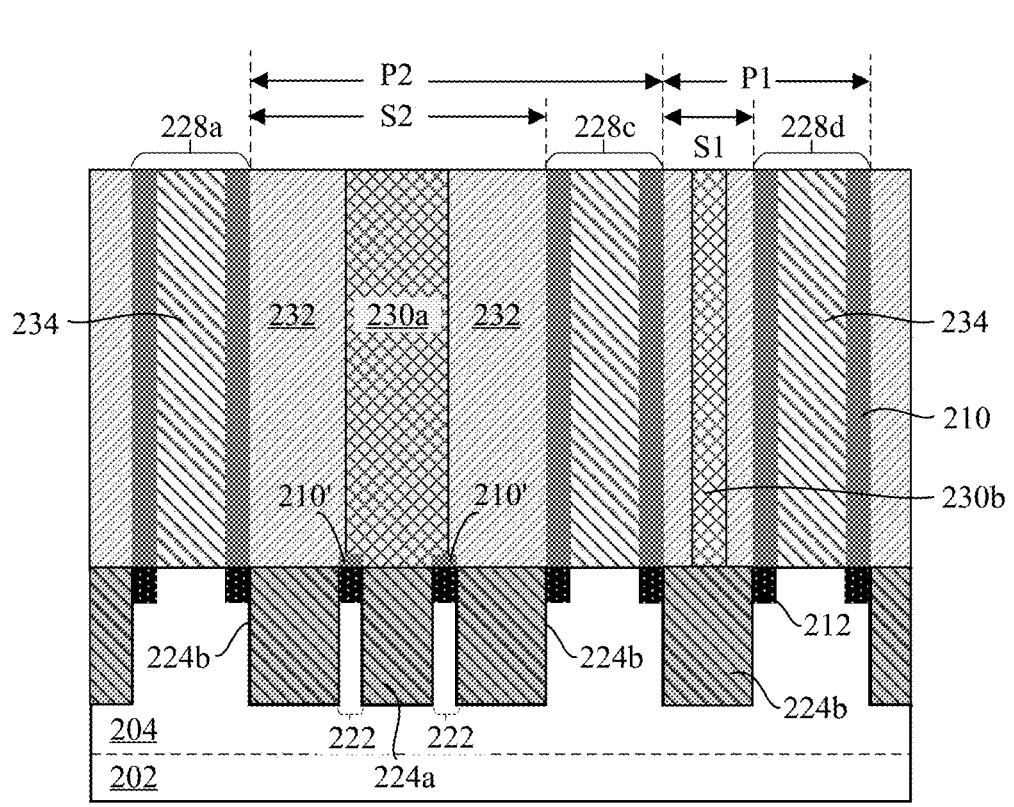
Figure 10B:
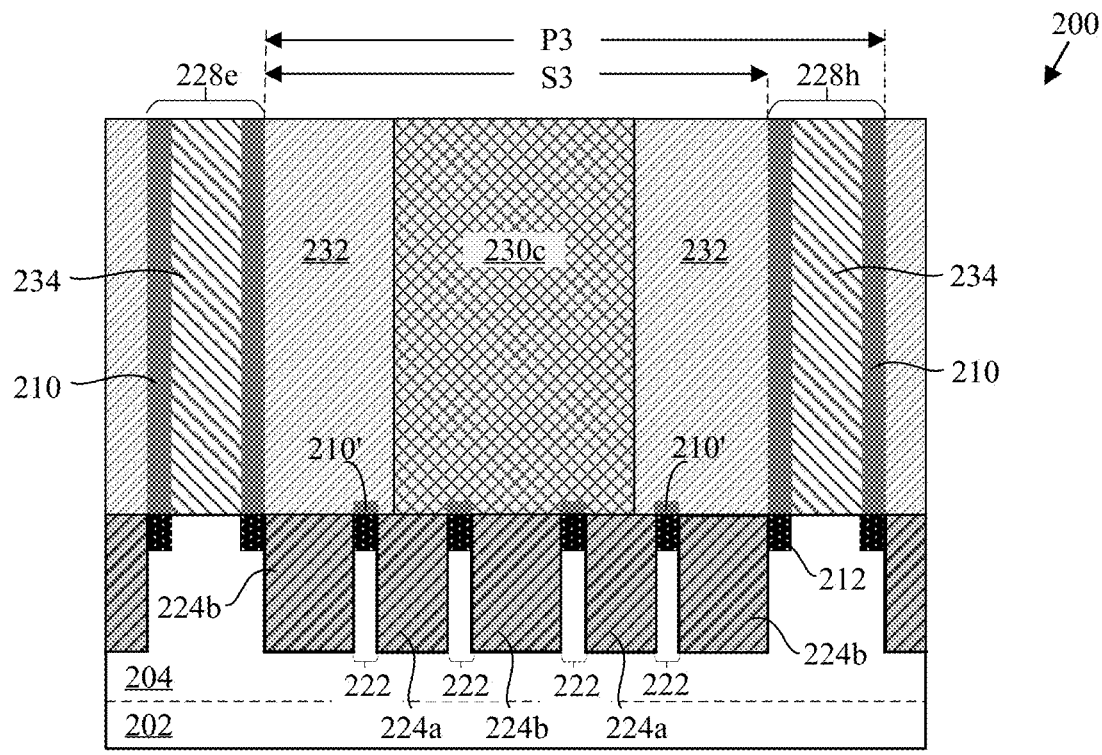

Referring to FIG. 10A and FIG. 10B (FIG. 10A continues from the embodiment shown in FIG. 9A, and FIG. 10B continues from the embodiment shown in FIG. 9B), additional fabrication steps may have been performed to form replacement gates 228 and contact structures 230. The fabrication steps to form the replacement gates 228 may include one or more deposition process operations to form replacement gate structures 234, for example, gate insulating layer(s) (e.g., silicon dioxide, hafnium oxide, or a layer of high-k dielectric material having a dielectric constant of typically 10 or greater, etc.) and conductive layer(s) (e.g., seed layers, work function layers or fill layers, etc.) that may be part of the gate electrode of the replacement gate structures 234. The gate insulating layers and the conductive layers are not shown in the accompanying drawings. The replacement gate structures 234 and the spacer structures 210 form the replacement gates 228 of the semiconductor device 200.

The contact structures 230 may be formed over and electrically couple with the plurality of semiconductor structures 224 using known semiconductor fabrication processes, including the following exemplary process. An insulating layer 232 may be deposited over the replacement gate structures 228 and the semiconductor structures 224 using a suitable deposition process. Contact openings (not shown) may be formed in the insulating layer 232, over the semiconductor structures 224 and between a pair of adjacent replacement gates 228, using suitable patterning processes. In an embodiment of the disclosure, the contact opening (not shown) may be positioned equidistant between the pair of adjacent replacement gates 228. In another embodiment of the disclosure, the contact opening (not shown) may be positioned closer to one of the pair of the adjacent replacement gates 228.

A conductive material may be deposited in the contact opening (not shown) using a suitable deposition process. The conductive material may include tungsten, copper, aluminum, alloys of these metals and/or combinations thereof. In this embodiment of the disclosure, the contact structure 230 is preferably formed of tungsten. The conductive material may overfill the contact opening and a suitable planarization process may be performed to form a top surface substantially coplanar with a top surface of the insulating layer 232.

Although not shown in FIGS. 10A and 10B, one or more liners may be deposited during the formation of the contact structure 230. For instance, an adhesion liner and/or a barrier liner may be deposited in the contact opening before the conductive material deposition. The adhesion liner may include metal silicides, such as titanium silicide, nickel silicide or other suitable adhesion material having any suitable thickness. The barrier liner may include metal nitrides, such as titanium nitride, tantalum nitride or other suitable barrier material having any suitable thickness.

Also illustrated in FIGS. 10A and 10B, the contact structures 230 may have varying widths, depending on the design for the semiconductor device 200. A contact structure in a wide gate pitch region of the semiconductor device may have design freedom of having a larger contact width. For example, the contact structure 230a between the pair of adjacent replacement gates 228a and 228c, as illustrated in FIG. 10A, may have a wider contact width than the contact structure 230b between the pair of adjacent replacement gates 228c and 228d. In another example, the contact structure 230c between the pair of adjacent replacement gates 228e and 228h, as illustrated in FIG. 10B, may have a wider contact width than either of the contact structures 230a and 230b in FIG. 10A.

A contact structure 230 having a wider contact width may advantageously decrease the electrical resistance of the contact structure 230. However, the wider contact structure 230 may correspondingly induce higher parasitic capacitance with the pair of adjacent replacement gates 228. The parasitic capacitance may increase with a decreasing distance between the contact structure 230 and the pair of adjacent replacement gates 228. Therefore, the balance of the overall parasitic capacitance and contact electrical resistance needs to be carefully balanced when designing the semiconductor device, especially for RF applications.

Figure 11A:
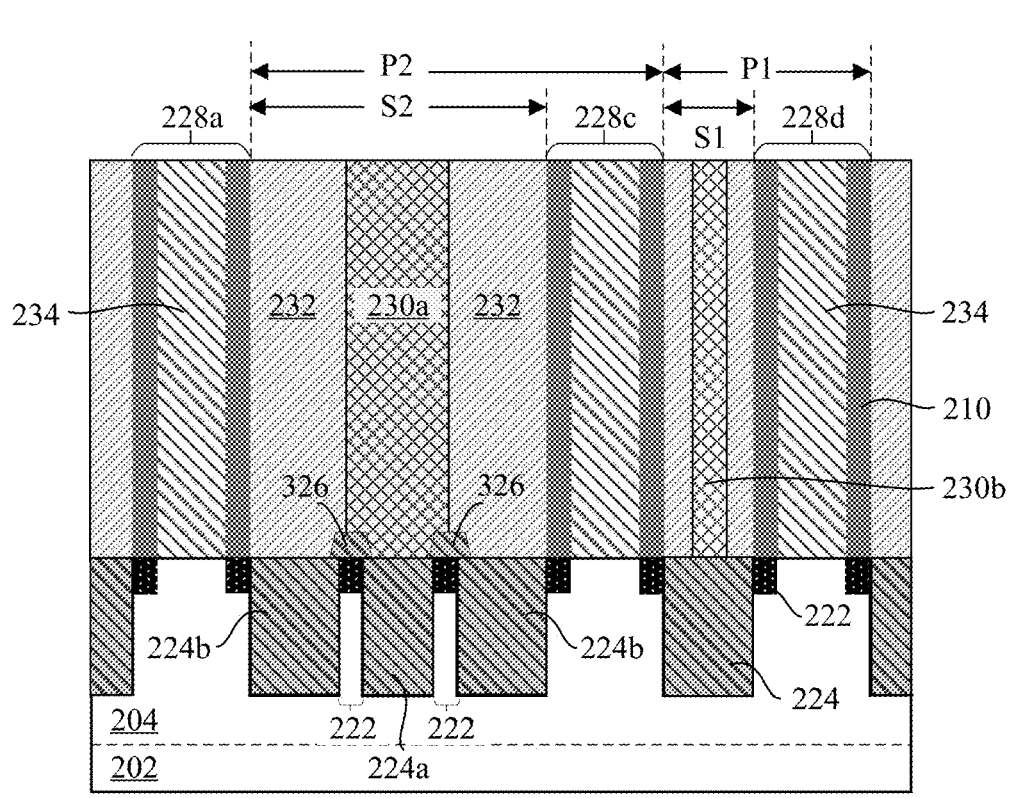
FIGS. 11A and 11B are cross-sectional views of another exemplary semiconductor device formed in accordance with embodiments of the disclosure.
Figure 11B:
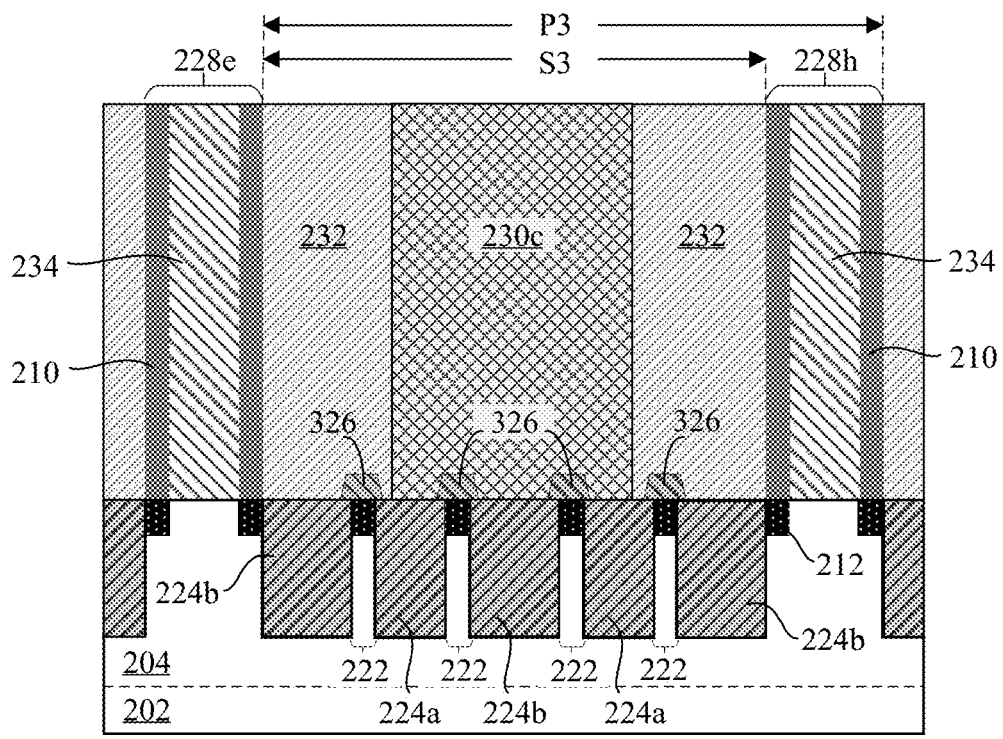

FIG. 11A and FIG. 11B illustrate cross-sectional views of a semiconductor device 300, according to another embodiment of the disclosure. FIG. 11A is similar to FIG. 10A, and FIG. 11B is similar to FIG. 10B, with the addition of a semiconductor cap layer 326 being formed above each of the pillar structures 222. Features in FIGS. 11A and 11B common with features in FIGS. 10A and 10B, respectively, are labeled with the same reference numerals.

A plurality of cavities (not shown in FIGS. 11A and 11B, which are analogous to the plurality of cavities 220 in FIGS. 8A and 8B) may be formed in the active region 204 using fabrication steps similar to that described with respect to FIGS. 1 through 8. Thereafter, the mask spacer structures (not shown in FIGS. 11A and 11B, which are analogous to the mask spacer structures 210' in FIGS. 10A and 10B) that are above the pillar structures 222 may be completely removed during the cleaning process prior to forming the plurality of semiconductor structures 224 and resulting in top surfaces of the pillar structures 222 being exposed.

During the formation of the plurality of semiconductor structures 224 in the active region 204, semiconductor material is also concurrently grown over the top surface of each of the pillar structures 222 to form the semiconductor cap layers 326 having a top surface above the top surface of the active region 204. The top surfaces of the semiconductor cap layers 326 are correspondingly above the top surfaces of the semiconductor structures 224. As the top surfaces of the pillar structures 222 have smaller semiconductor surface areas, less amount of semiconductor material is expected to be grown in the same period of time. The semiconductor cap layer 326 bridges and electrically connects with the adjacent semiconductor structures 224 in the active region 204. For example in FIG. 11A, the semiconductor cap layer 326 bridges and electrically connects with the semiconductor structure 224a having the first width and the second semiconductor structure 224b having the second width.

It is within the scope of this disclosure that an optional doping process may be performed on the semiconductor structures 224 and the semiconductor cap layers 326. In an example, to form NMOS device regions, the semiconductor structures 224 and the semiconductor cap layers 326 may be doped with N-type donors. The N-type donors may include phosphorus, arsenic, antimony, and/or other suitable dopants. In another example, to form PMOS device regions, the semiconductor structures 224 and the semiconductor cap layers 226 may be doped with P-type acceptors. The P-type acceptors may include boron, aluminum, gallium, indium, and/or other suitable dopants.

It is understood that the semiconductor devices 200 and 300 disclosed herein may undergo further processing to form various semiconductor features known in the art. For example, gate contacts may be formed in the insulating layer to electrically connect with the replacement gate structures to other regions of the semiconductor device, e.g., back-end-of-line (BEOL) region of the semiconductor device. The BEOL region typically includes a plurality of conductive lines and interconnect vias that are routed, as needed, across the semiconductor device.

In the above detailed description, semiconductor devices having a plurality of semiconductor structures in wide gate pitch regions and methods of forming the same are presented. By using the disclosed methods, a plurality of odd-numbered semiconductor structures are formed between a pair of adjacent gates in an active region having a lower local pattern density (e.g., in a wide gate pitch region). The pair of adjacent gates has a gate width. The plurality of semiconductor structures includes a first semiconductor structure having a first width substantially equal to the minimum gate spacing of the semiconductor device and a second semiconductor structure having a second width substantially equal to the gate width. The plurality of semiconductor structures is arranged in an alternating arrangement configuration having the first width and the second width.

Additionally, each of the semiconductor structures in the wide gate pitch region is separated by a pillar structure of the active region. The pillar structures have a width substantially equal to the width of the spacer structures of the gates. The pillar structure provides additional surface planes, thereby increases the local pattern density, enabling a substantially uniform growth of the semiconductor structures in a wide gate pitch region. A semiconductor cap layer may be formed over the pillar structure. The semiconductor cap layer bridges and electrically connects with the adjacent semiconductor structures.

A contact structure is formed between the pair of adjacent gate structures, and may be positioned equidistant between the pair of adjacent replacement gates 228 or may be positioned closer to one of the pair of the adjacent replacement gates. For example, by placing the contact structure equidistant from the pair of adjacent gate structures, parasitic capacitance between the contact structure and the adjacent gate structure may be effectively reduced. Lowering parasitic capacitance in a semiconductor device is particularly advantageous for RF applications. Higher switching speed for high-powered RF devices with lower RF signal losses can be achieved when the semiconductor device is operating at a high frequency.

To further improve the performances of the RF devices, the contact structures of the RF devices that are placed in a wide gate pitch region allow the contact structures to have wider widths than those contact structures placed in a 1×CPP gate pitch region. Contact structures having wider widths will gain the beneficial effect of lower electrical resistance within the contact structures.

It should be appreciated that the design consideration of the contact structure needs to be carefully optimized and balanced between the width of the contact structure and the associated parasitic capacitance acceptance level and the contact electrical resistance acceptance level. The parasitic capacitance increases with a decreasing distance between the contact structure and the gate structures. It may be therefore advantageous to position the contact structure equidistant from the gate structures, thereby creating a greater distance between the contact structure and the gate structures. The contact electrical resistance, however, decreases with increasing widths of the contact structure. The wider width of contact structure will correspondingly induce higher parasitic capacitance between the adjacent gate structures. Therefore, the balance of the overall parasitic capacitance and contact electrical resistance needs to be carefully balanced when designing the semiconductor device for RF applications.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the methods of forming the semiconductor structure disclosed herein may be employed in manufacturing a variety of different integrated circuit products, including, but not limited to, RF semiconductor devices, logic products, memory products, 3D transistor devices, FinFET transistor devices, planar transistor devices, CMOS devices, SOI devices etc.

What is claimed is:

1. A semiconductor device comprising:
   a substrate;
   an active region over the substrate;
   a pair of gates over the active region, each gate of the pair of gates comprising a gate structure and a pair of spacer structures disposed on sidewalls of the gate structure; and
   a plurality of semiconductor structures between the pair of gates, the plurality of semiconductor structures having an alternating arrangement configuration of a first width and a second width, wherein the first width is substantially equal to a width of the gate structure; and
   a plurality of pillar structures separating the plurality of semiconductor structures.

2. The device of claim 1, wherein each spacer structure of the pair of spacer structures has a spacer structure width and each pillar structure of the plurality of pillar structures has a pillar structure width that is substantially equal to the spacer structure width.

3. The device of claim 1, wherein the plurality of semiconductor structures includes an odd number of semiconductor structures.

4. The device of claim 1, wherein each pillar structure of the plurality of pillar structures comprises a doped region at an upper portion of the pillar structures.

5. The device of claim 1, further comprising a semiconductor cap layer over each pillar structure of the plurality of pillar structures.

6. The device of claim 5, wherein the semiconductor cap layer bridges a first semiconductor structure having the first width and a second semiconductor structure having the second width.

7. The device of claim 1, further comprising a contact structure disposed over at least one of the semiconductor structures and between the pair of gates.

8. A semiconductor device comprising:
   a substrate;
   an active region over the substrate;
   a pair of gates over the active region, each gate of the pair of gates comprising a gate structure and a pair of spacer structures disposed on sidewalls of the gate structure;
   a plurality of semiconductor structures between the pair of gates, the plurality of semiconductor structures having an alternating arrangement configuration of a first width and a second width, wherein the first width is substantially equal to a width of the gate structure;
   a plurality of pillar structures separating the plurality of semiconductor structures; and
   a semiconductor cap layer over each pillar structure of the plurality of pillar structures and bridging a first semiconductor structure having the first width and a second semiconductor structure having the second width.

9. The device of claim 8, wherein the semiconductor cap layer has a top surface above top surfaces of the plurality of semiconductor structures.

10. The device of claim 8, wherein the plurality of semiconductor structures includes an odd number of semiconductor structures.

11. A method of forming structures in a semiconductor device comprising:
    providing a substrate;
    forming an active region over the substrate;
    forming a pair of gates over the active region, wherein the forming of each gate of the pair of gates comprising forming a gate structure and forming a pair of spacer structures on sidewalls of the gate structure; and
    forming a plurality of semiconductor structures and a plurality of pillar structures between the pair of gates, the plurality of semiconductor structures having an alternating arrangement configuration of a first width and a second width, wherein the first width is substantially equal to a width of the gate structure, and the plurality of semiconductor structures is separated by the plurality of pillar structures.

12. The method of claim 11, wherein the forming the plurality of pillar structures comprises forming each pillar structure of the plurality of pillar structures such that a pillar structure width is substantially equal to a width of the spacer structure.

13. The method of claim 11, wherein the forming of the plurality of semiconductor structures comprises:
    forming a plurality of cavities as the plurality of pillar structures are being formed, the plurality of cavities having a first cavity width and a second cavity width, wherein the first cavity width is substantially equal to the width of the gate structure; and
    filling the plurality of cavities with semiconductor material to form the plurality of semiconductor structures.

14. The method of claim 13, wherein the filling of the plurality of cavities comprises growing a semiconductor material in the plurality of cavities to form the plurality of semiconductor structures.

15. The method of claim 13, wherein the forming of the plurality of cavities forms an odd number of cavities and the forming of the plurality of pillar structures forms an even number of pillar structures.

16. The method of claim 11, wherein the forming of the plurality of semiconductor structures further comprises forming a semiconductor cap layer above each pillar structure of the plurality of pillar structures.

17. The method of claim 16, wherein the semiconductor cap layer is formed by growing a semiconductor material over a top surface of each pillar structure of the plurality of pillar structures during the formation of the plurality of semiconductor structures.

18. The method of claim 17, wherein the forming of the semiconductor cap layer includes bridging the semiconductor structure having the first width and the semiconductor structure having the second width with the semiconductor cap layer.

19. The method of claim 11, further comprising forming a contact structure over at least one of the semiconductor structure.

20. The method of claim 11, further comprising forming a doped region at upper portions of each pillar structure of the plurality of pillar structures.

\* \* \* \* \*